United States Patent [19]

Strüwe et al.

[11] Patent Number: 5,509,619
[45] Date of Patent: Apr. 23, 1996

[54] PRINTING EQUIPMENT ACCESSORY, ESPECIALLY FOR MAKING PROOF PRINTS

[75] Inventors: Volker Strüwe, Dietzenbach; Ladislaus Wojtanowitsch, Aschaffenburg; Gregor Gehrer, Hallein/Rehhof; Thomas Brötzner, Wals, all of Germany

[73] Assignee: E. I. Du Pont de Nemours and Company, Wilmington, Del.

[21] Appl. No.: 177,870

[22] Filed: Jan. 5, 1994

[30] Foreign Application Priority Data

Jan. 15, 1993 [DE] Germany .......................... 43 00 866.6

[51] Int. Cl.6 ................................................ B65H 75/24
[52] U.S. Cl. ............................................... 242/573.2
[58] Field of Search ........................ 156/278, 192, 156/344; 242/532, 532.5, 571, 572, 573.3, 573.4, 573.9, 573

[56] References Cited

U.S. PATENT DOCUMENTS

| | | | |
|---|---|---|---|
| 1,973,980 | 9/1934 | Graffenberger | 242/573.3 |
| 1,981,556 | 11/1934 | Langdon | 242/573 |
| 2,707,596 | 5/1955 | Ehret | 242/573 |
| 2,727,700 | 12/1955 | Van Colle et al. | 242/573.2 |
| 3,079,102 | 2/1963 | Douglas | 242/573 |
| 3,323,745 | 6/1967 | Kondur, Jr. | 242/573 |
| 3,721,398 | 3/1973 | Azzalin et al. | 242/573.2 |
| 3,917,187 | 11/1975 | Damour | |
| 3,997,176 | 12/1976 | Wyckoff et al. | 279/2 R |
| 4,461,430 | 7/1984 | Lever | |
| 4,500,046 | 2/1985 | Woenker | |
| 4,667,890 | 5/1987 | Gietman, Jr. | |
| 4,790,491 | 12/1988 | Mundus et al. | |
| 5,155,010 | 10/1992 | Sandner | 430/291 |
| 5,168,752 | 12/1992 | Konermann et al. | 73/150 R |
| 5,227,826 | 7/1993 | Sandner | 354/301 |

FOREIGN PATENT DOCUMENTS

| | | |
|---|---|---|
| 0555928A1 | 8/1993 | European Pat. Off. . |
| 3029411A1 | 2/1982 | Germany . |
| 3239661A1 | 5/1984 | Germany . |
| 57-154323 | 9/1982 | Japan ........................ 242/573 |
| 1345226 | 1/1974 | United Kingdom . |
| 2100191 | 12/1982 | United Kingdom . |
| 2213950 | 8/1989 | United Kingdom . |

Primary Examiner—John P. Darling
Attorney, Agent, or Firm—Thomas H. Magee

[57] ABSTRACT

A printing equipment accessory, especially for making proof prints, with at least two rollers forming a roller nip, through which is passed at least one function component of a film from a supply roll, the film having an auxiliary component in addition to the function component, whereby the function component is transferable in the roller nip onto a base. Reuse of the auxiliary component of the film is simplified by such an accessory. The auxiliary component of the film forms a coreless roll.

11 Claims, 3 Drawing Sheets

PRINTING EQUIPMENT ACCESSORY, ESPECIALLY FOR MAKING PROOF PRINTS

BACKGROUND OF THE INVENTION

1. Field of the Invention

This invention relates to a printing equipment accessory, especially for making proof prints, with at least two rollers forming a roller nip through which is fed film from a supply roll, the film having a function component and an auxiliary component and the function component being transferable in the roller nip onto a base.

2. Description of Related Art

Such types of accessory apparatus are used, for example, to proof color separations. A composite film comprising a photopolymerizable layer between a support and a protective cover is taken from a supply roll as a first step. Before the film is passed into the roller nip, the protective cover is pulled off the polymerizable layer. The remainder of the film, the function component, is laminated on a base, for example, a paper sheet. The paper sheet with the photopolymerizable layer is exposed through an appropriate negative or positive, whereupon the exposed or unexposed areas, depending on composition, polymerize, whereas the remaining areas remain tacky. If necessary, the support layer muse still be removed. Color particles are now applied to the tacky areas. This can be done, for example, with a color transfer film having color particles on a support layer. This color film together with the exposed paper is passed through the roller nip. The pressure in the nip causes the color particles to adhere to the tacky areas and to separate from the color film when the color film is separated from the paper sheet. In this case, the color particles remaining on the paper sheet are the function component of the color film, whereas the support with the remaining color particles is the auxiliary component of the color film.

Other uses are laminating composite films or other coated materials, such as, for example, solder mask or dry film resist, on circuit boards to make printed circuits or to process hot melt adhesive films. In all of these uses, the auxiliary component, thus, for example, the protective cover or the support film with the remaining color particles, is waste that cannot be used for concurrent or subsequent proofing steps.

The auxiliary component of the film can be rewound to minimize the volume of this waste after being separated from the function component. For this purpose, an aid, for example, an adhesive band, attaches the beginning of the auxiliary component to a cardboard or synthetic resin core. This core can be, for example, the core from a used supply roll. Environmental protection dictates that not only must the waste volume be reduced, but it must be avoided. Therefore, attempts are made to reuse existing waste or to employ products that can be used many times, the so-called multiuse products.

To reuse the film's auxiliary component, it must be separated from the core to obtain an unblemished product. The auxiliary component of the film can be unwound from the core; this consumes time and work. Therefore, the film roll is usually cut off and the core removed. However, this generates film slivers and additional contamination. It also increases the volume of waste. The necessary added work increases the setup time and incurs needless expense. The core is usually damaged during cutting and therefor cannot be reused in the multiuse system.

SUMMARY OF THE INVENTION

This invention is based on the problem of simplifying the use of at least the auxiliary component of the film.

The problem is solved by a device of the abovedescribed type wherein the auxiliary component of the film forms a coreless roll.

The roll thus comprises only the auxiliary component of the film. It does not include other materials, for example, a core. It can be reused without further processing. Defects imported by foreign material in the batch to be reused can be largely avoided without having to spend the additional time for quality control. Moreover, processing time can be saved by this type of handling. The cores, which now do not have to be used to make a roll of the auxiliary component of the film, can be reused elsewhere within the concept of a multiuse system.

In a preferred embodiment, the coreless roll is wound on a spindle with a variable outer diameter. The outer diameter is enlarged for winding. When the roll is complete, the spindle diameter is decreased so that it becomes possible to pull the spindle out of the roll. This simplifies handling significantly.

A preferred version of the spindle has at least two curved sections, whose spacing from the spindle axis can be varied. Increasing this spacing increases the spindle diameter, and decreasing this spacing decreases the spindle diameter. In this manner, the diameter can be changed very simply.

At least one end of the spindle has preferably a cone that can be moved axially on the spindle. The inclined surface of the cone operates against the curved sections. When the cone is moved into the spindle, that is, in the direction between the curved sections, it spreads the sections away from each other. When the cone is moved axially in the other direction, the spindle diameter decreases because the curved sections can now be moved together again.

It is also advantageous to have at least one elastic tension ring on the inner side of the curved sections, connecting all of the curved sections. On one hand, this tension ring holds the curved sections together so that they do not collapse outward as the cones exert pressure when moved inward, but the curved sections are rather held against the inclined surfaces of the cones. On the other hand, the tension ring automatically decreases the outer diameter of the spindle by pulling the curved sections together to the extent permitted by the cones when they are moved outward.

The spindle axis preferably has guide rings forming a stop for the radial inward movement of the curved sections. This limits the outer diameter of the spindle to a minimum size.

The guide rings advantageously have slots that engage projections on the curved sections. The rings thus not only limit but also guide the movement of the curved sections. This assures a mechanically more stable construction of the spindle and an adequately accurate positioning of the individual parts relative to each other. In particular, this assures an adequate roundness of the spindle as is required for many windup uses.

The projections are preferably flat bar shapes. The curved sections are thus reliably positioned and guided independently of the axial position of the guide rings. The effective length of the spindle can be varied relatively easily by a simple replacement of the curved sections.

It is also advantageous for the cone to have slots corresponding to those of the guide rings. The projections can thus also mesh with the cone. In this manner, the curved sections are also guided into the cone. The spindle can now be driven by the cone. Driving power can also be applied by the guide rings, if the spindle axis is rotated.

The guide rings preferably can be moved axially on the tubular shaft. This permits adapting for various lengths of the curved sections.

In another preferred embodiment, friction rings can be attached on the circumference of the spindle. The spindle can be driven by means of these friction rings. The friction rings also form an axial boundary for the roll, so that it remains axially compact and the individual wraps on the roll do not slip axially. The friction rings can be attached in various axial positions for adapting to various film widths.

The spindle is preferably supported in a vertical slot, with the friction rings contacting the supply roll or the drive rings attached thereto. Gravity forces the spindle downwards in the vertical slot. This results in the necessary drive friction between the friction rings and the supply roll or its drive rings. The supply roll can then be driven with the spindle thus assuring that as the supply roll is unwound, the waste, the auxiliary component of the film, is simultaneously wound on the spindle.

The spindle preferably has magnets with a keeper to hold the end of the film. At the start of the winding step, the film is attached to the outer periphery of the spindle by placing the film in the area of the magnets on the spindle and placing the iron keeper, for example, a thin metal strip, on the film. Magnetic forces hold the iron keeper on the spindle. The beginning of the film is thus clamped between the iron keeper and the spindle. The winding step can then proceed. At the end, whenever the film is removed from the spindle, the diameter of the spindle is reduced and the spindle is withdrawn. The clamping force between the iron keeper and the magnets is directed radially. This permits axial movement between the magnet and the iron keeper. When the roll is removed from the spindle, the keeper drops out.

The invention also involves a process for reusing at least a part of a film comprising a function component and an auxiliary component, whereby the auxiliary component is wound without a core after the function component and the auxiliary component are separated. This largely avoids using additional materials that can contaminate a batch of auxiliary component to be reused.

BRIEF DESCRIPTION OF THE DRAWINGS

The invention can be more fully understood from the following detailed description thereof in connection with accompanying drawings described as follows.

DESCRIPTION OF THE PREFERRED EMBODIMENT(S)

Figure 1:
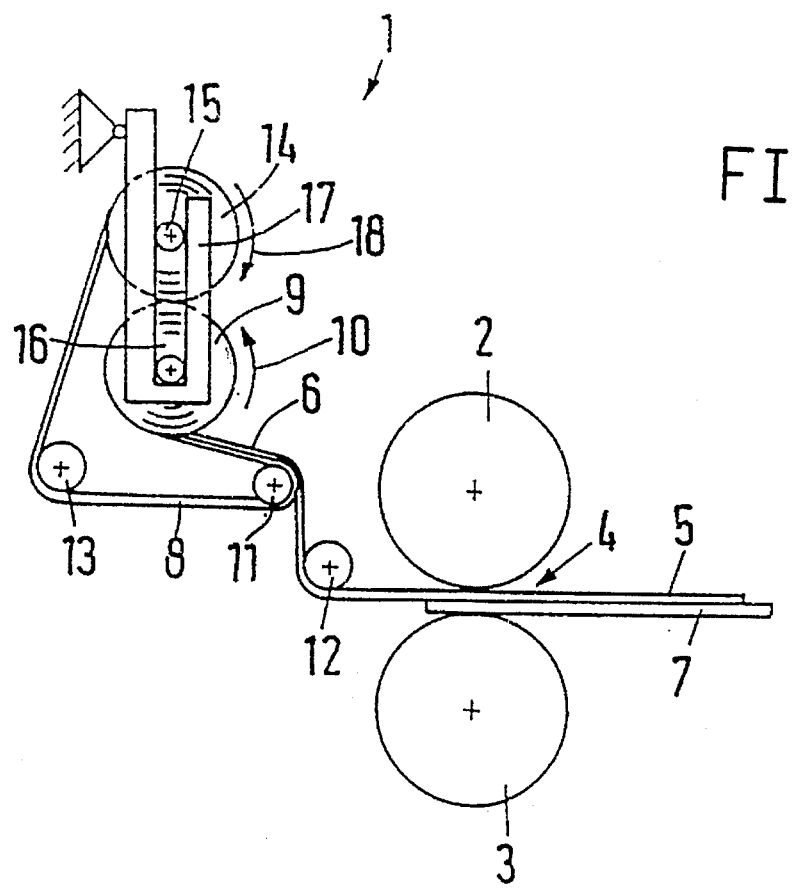
FIG. 1 illustrates one version.

Throughout the following detailed description, similar reference characters refer to similar elements in all figures of the drawings.

The printing equipment accessory 1 has two rollers 2, 3 forming between them a roller nip 4. The two rollers 2, 3 are driven by opposing forces so that a function component 5 of a film 6 can be laminated on a base 7 by the pressure in the nip 4. The film 6 has a function component 5 and an auxiliary component 8. The film 6 is thus a composite. In the present case, the function component 5 comprises a support film bearing a photopolymerizable layer. Before separation, the photopolymerizable layer is covered by a protective film that forms the auxiliary component 8. The thickness of the film 6 is actually only a fraction of a millimeter. To simplify the drawing, the photopolymerizable layer is not shown separately. It is a part of the function component 5. The base 7 can be, for example, a paper sheet.

The film 6 is unwound from a supply roll 9 rotating in the direction of arrow 10. After the film 6 is unwound from the supply roll 9, the auxiliary component is separated from the function component 5 at the separating roller 11. The function component 5 is passed around a first idler roller 12 toward the nip 4. The auxiliary component 8 is passed around a second idler roller 13 to a coreless roll 14. The roll 14 has a spindle 15 supported in a vertical bearing slot 16 of a stationary housing 17. The same bearing slot 16 supports the rotatable supply roll 9. The roll 14 rests on the supply roll 9 optionally with friction rings shown in detail in FIG. 3. Rotating the supply roll 9 to unwind the film 6 also drives the roll 14 and winds the auxiliary component 8 of the film 6.

After the function component 5 is laminated on the base 7, the resulting composite base 7' is exposed through a negative or positive to polymerize the exposed or unexposed areas of the photopolymer, depending on its composition. After the support film is removed, the polymerized or unpolymerized areas of the photopolymer, depending on composition, remain tacky. These tacky areas can be colored by the application of color particles.

Figure 2:
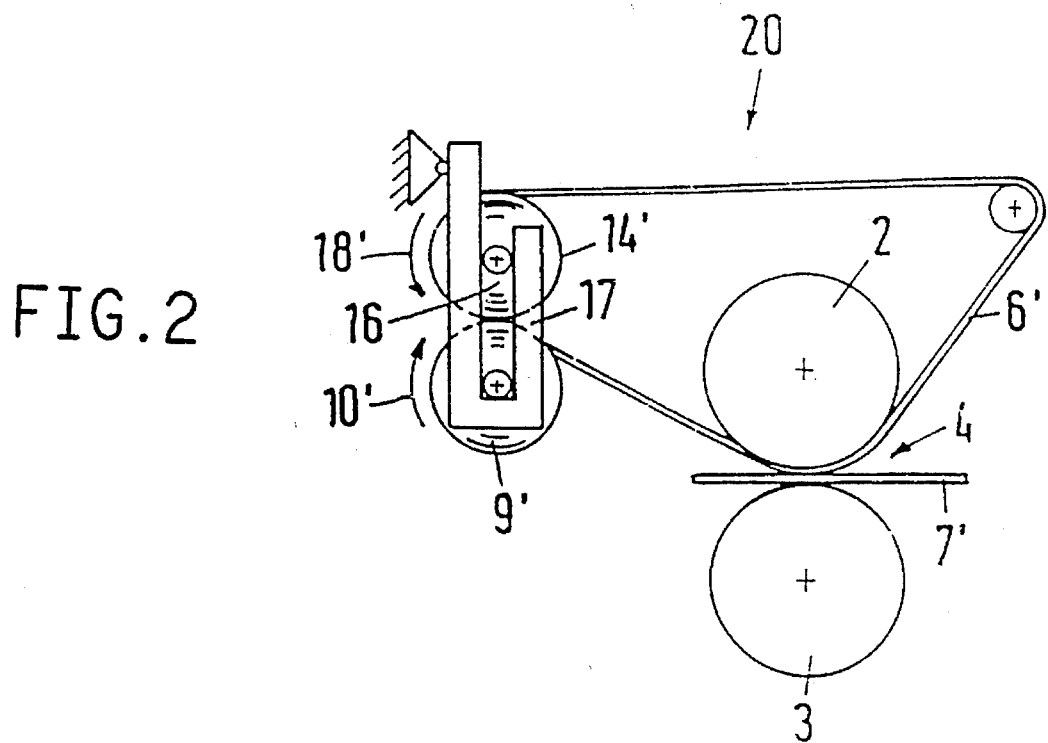
FIG. 2 illustrates a second version.

A similar device 20, shown in FIG. 2, is used to apply color to the composite base 7'. The reference numbers used in FIG. 1 are also used in FIG. 2 for the same parts, but with the addition of apostrophes in most cases.

In the embodiment shown in FIG. 2, composite film 6' is passed through the roller nip 4 together with the base 7 that was coated by the apparatus 1 in FIG. 1 and that is designated here as 7'. The film 6' comprises a support bearing color particles. The support is the auxiliary component. The color particles are the function component of this film 6'. When the base 7' and the film 6' are passed together through the nip 4, the pressure of the two rollers 2, 3 forming the nip 4 transfers some of the color particles onto the tacky areas of the base 7' where they adhere. The film 6' plus nontransferred color particles exiting from the nip 4 are now waste and wound on the coreless roll 14'.

FIG. 2 also shows the roll 14' being driven by the supply roll 9'. However, it is obvious that roll 14' can be driven by any other means, for example, by its own motor or by a motor providing a common drive for the roll 14', the supply roll 9 and/or the rollers 2, 3.

When the supply rolls 9 or 9' are empty, the coreless roll 14, 14' is full with the entire auxiliary component of the film 6, 6'. Thus, the entire roll 14, 14' can be reused.

Figure 3:
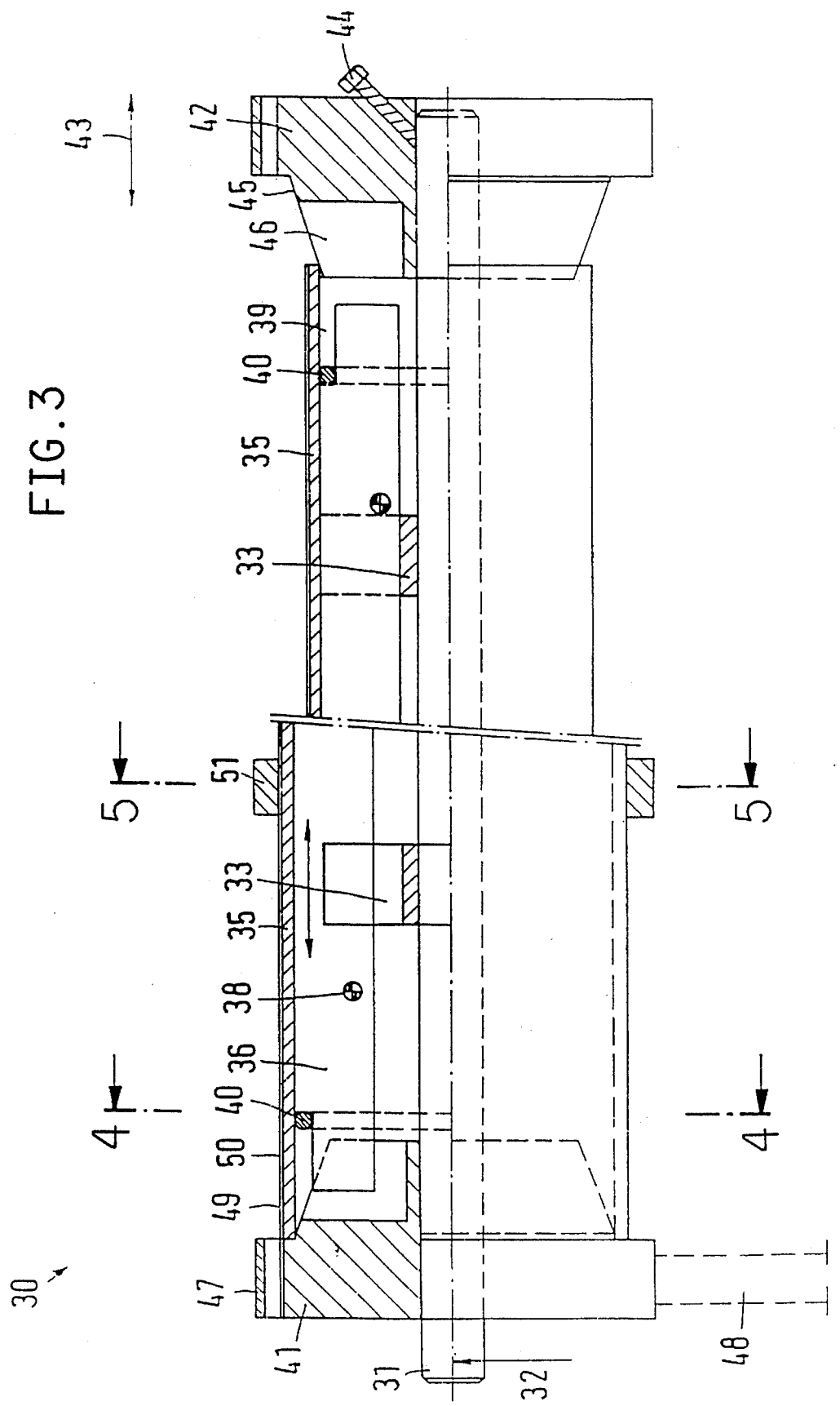
FIG. 3 is a longitudinal section through a spindle.
Figure 4:
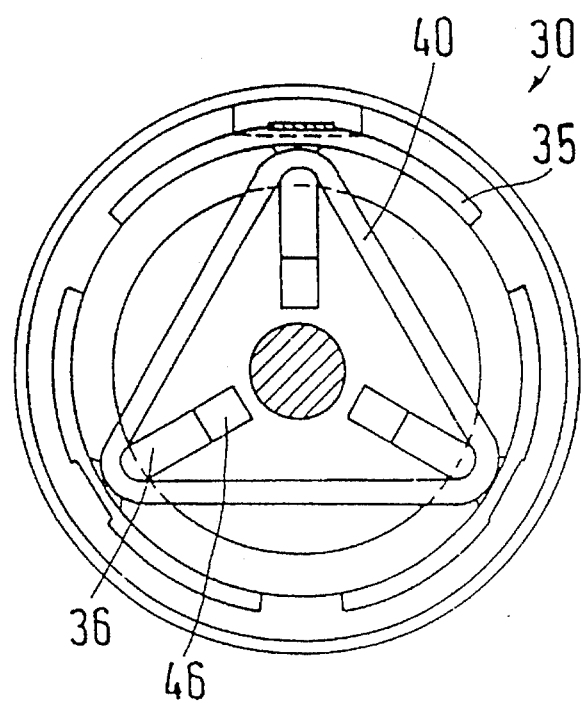
FIG. 4 is a section 4—4 from FIG. 3.
Figure 5:
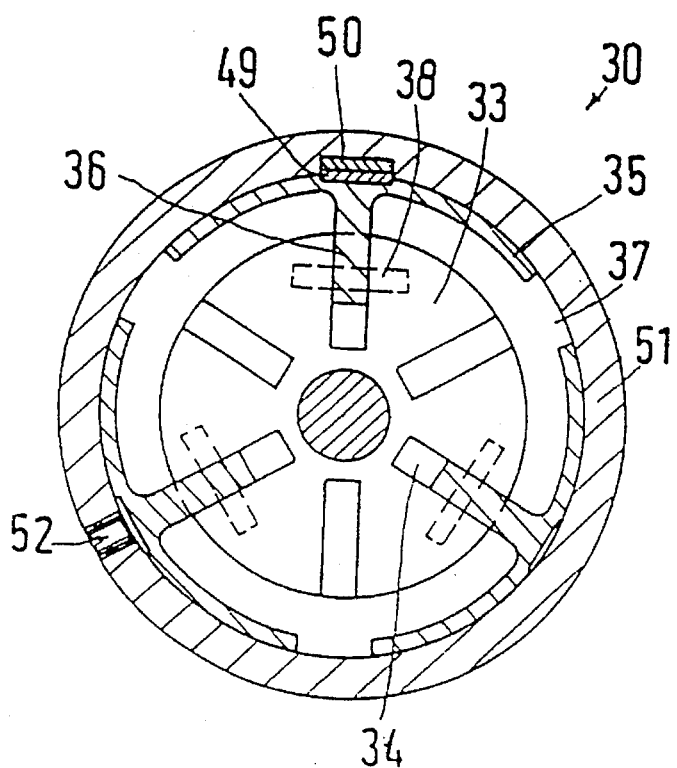
FIG. 5 is a section 5—5 from FIG. 3.

A spindle 30, shown in detail in FIGS. 3 to 5, winds the rolls 14, 14'. The spindle 30 has a variable outer diameter. The left side of FIG. 3 shows the operation of the spindle 30 at its maximum outer diameter. The right side shows it at its minimum outer diameter.

The spindle 30 has a shaft 31 supported in bearings 32 shown only schematically. The shaft 31 is positioned along a longitudinal axis of the spindle 30. The bearing 32 supporting the spindle shaft 30 can be dish-shaped, punctiform, or circular. The bearing area can be sleeve bearings or ball bearings. It is recommended that the spindle shaft 30 be supported at both ends.

Several, two in this example, slotted guide rings 33 that can be moved axially are located axially on the spindle shaft 31. The rings 33 have slots 34 which are oriented radially. As shown in the right half of FIG. 3, the guide rings 33 serve as stops for the radial inward movement of curved sections 35, which have flat projections 36 pointing radially inward. These projections 36 are guided into the slots 34 of the guide rings 33. The curved sections 35 can be made of cold-drawn material. Their outer periphery is in the shape of a partial cylinder surface. Several curved sections 35 together almost form a cylinder with a surface broken only by the spaces 37. However, the spaces 37 do not affect the roundness of a roll.

Stop pins 38 are located on the projections 36 to limit the axial movement of the guide rings 33.

The projections 36 have end recesses 39 in which are located elastic tension rings 40. The rings 40 are slightly pretensioned and hold the individual curved segments 35 with their projections 36 in the slots 34 of the guide rings 33. Two locking cones 41, 42 are located on the spindle shaft 31, one 41 being fixed on the shaft 31, while the other 42 can be moved axially in the direction of double arrow 43 and can be fixed in place axially on the spindle shaft 31 by a set screw 44. Obviously, the two locking cones 41, 42 also can be axially mobile. However, it must be possible to fix them in at least one predetermined position on the spindle axis.

When the two locking cones 41, 42 are shifted toward each other, the spindle 30 expands, that is, the diameter enlarges. The curved sections 35 slide radially outward on incline surfaces 45 of the cones 41, 42. This is counteracted only by the force exerted by the tension rings 40. When the locking cones 41, 42 are moved away from each other, the tension rings 40 draw the curved sections 35 together radially, thus decreasing the diameter. This is shown in the right half of FIG. 3.

The locking cones 41, 42 also have slots 46 corresponding to the slots 34 in the guide rings 33. The projections 36 on the curved sections 35 can fit in these slots 46 when the locking cones 41, 42 are moved toward each other.

The locking cones 41, 42 have friction rings 47 that transmit driving power from a drive disk 48. The drive disk 48 can also, but not necessarily, be attached to the supply roll 9. However, it can also be driven independently, so that the spindle 30 maintains permanent tension on the auxiliary component of the film 6 or 6' to be wound onto the roll 14 or 14', respectively.

Additional friction rings 51 can be attached on the external periphery of the curved sections 35 in various axial positions. In many instances, the friction rings 51 are already adequately held in place by the diameter enlargement of the curved sections 35 and secured against axial movement by the existing clamping forces. However, a set screw 52 can also be provided in the friction ring 51 to hold it on the curved section 35. Instead of set screw 52, one of more set pin can be used in conjunction with bore-holes in the curved sections 35 and in the friction ring 51. The friction rings 51 aid in adapting the spindle 30 to various web widths without changing the curved sections 35.

At least one curved section 35 has a small groove for a magnetic strip 49. A keeper 50, for example, an iron strip, is placed on the magnetic strip 49. The keeper 50 is held on the curved section 35 by the magnetic strip 49.

The spindle 30 is expanded before the start of the winding step, that is, the cones 41, 42 are moved toward each other and when the spindle 30 has reached its maximum outer diameter, it is placed on the spindle shaft 31. The leading end of the auxiliary component of the film 6, 6' to be wound is placed on the magnetic strip 49. The keeper 50 is placed on it and clamps the film or the auxiliary component thereof on the spindle 30. The force here is not exceptionally high, but it does suffice to fasten the leading end of the film on the spindle 30. It is often sufficient to place the film on the spindle and smooth it flat there. In particular, very thin films adhere sufficiently for the windup step. As soon as one or more film layers have been wound, the film adheres to the spindle 30 without further assistance.

When the roll 14, 14' is full, the spindle 30 with the roll 14, 14' is removed from the device 1, 20 and the spindle 30 is released, that is, the locking cones 41, 42 are moved away from each other, decreasing drastically the outer diameter of the spindle 30. The entire spindle 30 can now be withdrawn axially from the roll 14, 14'. The structure of the roll 14, 14' remains unchanged. During this step, the keeper 50 is pulled off the magnetic strip 49 and drops out after the spindle 30 is pulled out of the roll 14, 14'.

Those skilled in the art, having the benefit of the teachings of the present invention as hereinabove set forth, can effect numerous modifications thereto. These modifications are to be construed as being encompassed within the scope of the present invention as set forth in the appended claims.

What is claimed is:

1. Apparatus for making proof prints, with at least two rollers forming a roller nip, through which is passed at least one function component of a film taken from a supply roll, the film having an auxiliary component in addition to the function component, and the function component is transferable in the nip onto a base, characterized in that the auxiliary component of the film forms a coreless roll which is wound on a spindle with a variable outer diameter, friction rings are attached on a periphery of the spindle, and the spindle is supported in a vertical slot so that the friction rings contact the supply roll or drive rings attached thereto.

2. Apparatus for making proof prints, with at least two rollers forming a roller nip, through which is passed at least one function component of a film taken from a supply roll, the film having an auxiliary component in addition to the function component, and the function component is transferable in the nip onto a base, characterized in that the auxiliary component of the film forms a coreless roll which is wound on a spindle with a variable outer diameter where the spindle has a magnet that holds an end of the film with a keeper.

3. Process to reuse at least part of a film comprising a function component and an auxiliary component, the process comprising:

separating the function component and the auxiliary component;

winding the auxiliary component as a coreless roll on a spindle having a variable outer diameter;

reducing the outer diameter of the spindle;

removing the coreless roll from the spindle; and reusing the coreless roll.

4. Apparatus for making proof prints, with at least two rollers forming a roller nip, through which is passed at least one function component of a film taken from a supply roll, the film having an auxiliary component in addition to the function component, and the function component is transferable in the nip onto a base, characterized in that the auxiliary component of the film forms a coreless roll wound on a spindle with a variable outer diameter, where the spindle has at least two curved sections spaced at a variable distance from a spindle axis, and guide rings that form a stop for the radially inward movement of the curved sections.

5. The apparatus according to claim 4, characterized in that at least one end of the spindle has a cone that can be moved axially on the spindle.

6. The apparatus according to claim 4, characterized in that at least one elastic tension ring linking all curved sections is fastened on an inner side of the curved sections.

7. The apparatus according to claim 4, characterized in that the guide rings have slots that engage projections on the curved sections.

8. The apparatus according to claim 7, characterized in that the projections have flat bar shapes.

9. The apparatus according to claim 7, characterized in that at least one end of the spindle has a cone that can be moved axially on the spindle and the cone has slots corresponding to those in the guide rings.

10. The apparatus according to claim 4, characterized in that the guide rings can be moved axially along the spindle axis.

11. The apparatus according to claim 4, characterized in that friction rings are attached on a periphery of the spindle.

* * * * *